United States Patent [19]

Chen et al.

[11] Patent Number: 5,356,836
[45] Date of Patent: Oct. 18, 1994

[54] ALUMINUM PLUG PROCESS

[75] Inventors: Kuang-Chao Chen; Shaw-Tzeng Hsia, both of Taipei, Taiwan

[73] Assignee: Industrial Technology Research Institute, Hsinchu, Taiwan

[21] Appl. No.: 108,224

[22] Filed: Aug. 19, 1993

[51] Int. Cl.⁵ .................................... H01L 21/283
[52] U.S. Cl. ................... 437/194; 437/190; 437/192; 437/195
[58] Field of Search ............ 437/190, 192, 194, 195

[56] References Cited

U.S. PATENT DOCUMENTS

| | | | |
|---|---|---|---|
| 4,837,183 | 6/1989 | Polito et al. | 437/198 |
| 4,960,732 | 10/1990 | Dixit et al. | 437/192 |
| 4,994,162 | 2/1991 | Armstrong et al. | 204/192 |
| 5,007,372 | 4/1991 | Hattori et al. | 118/715 |
| 5,106,781 | 4/1992 | Penning DeVries | 437/192 |
| 5,108,951 | 4/1992 | Chen et al. | 437/187 |
| 5,240,880 | 8/1993 | Hindman et al. | 437/190 |

FOREIGN PATENT DOCUMENTS 0168828  1/1986 European Pat. Off. ........... 437/190
1-160036 6/1989 Japan ............................. 437/194

Primary Examiner—T. N. Quach
Attorney, Agent, or Firm—George O. Saile

[57] ABSTRACT

A new method of metallization of an integrated circuit is described. This method can be used for a first metallization to contact the semiconductor substrate regions or for a subsequent metallizations for interconnection within the integrated circuit. An insulating layer is provided over the surface of a semiconductor substrate or over a metallization layer. At least one contact opening is made through the insulating layer to the semiconductor substrate or to the metallization layer. A barrier metal layer is deposited over the surface of the substrate and within the contact opening wherein most of the barrier metal is deposited on the bottom of the contact opening rather than on the sides of the opening. A metal layer is cold sputtered over the barrier metal layer, then the metal is hot sputtered over the cold-sputtered metal layer wherein the cold and hot sputtering are continuous operations to complete the metallization of the integrated circuit.

29 Claims, 4 Drawing Sheets

ALUMINUM PLUG PROCESS

BACKGROUND OF THE INVENTION

(1) Field of the Invention

The invention relates to a method of metallization of an integrated circuit device, and more particularly, to a metallization method with good step coverage in the manufacture of an integrated circuit device.

(2) Description of the Prior Art

In the fabrication of integrated circuit devices, metal layers make contact to lower conductive layers of the integrated circuit through vias in an insulating layer. Aluminum is often used as the interconnection metal. However, the sputtering process used to apply the aluminum often results in incomplete filling of the via openings. Large aluminum grains tend to form on the surface of the insulating layer within the via openings, causing voids.

Differing temperatures and deposition rates have been used to try to overcome the problem of voids. U.S. Pat. Nos. 4,994,162 to Armstrong et al and 5,108,951 to Chen et al describe such methods.

SUMMARY OF THE INVENTION

A principal object of the present invention is to provide an effective and very manufacturable method of metallization in the manufacture of an integrated circuit which prevents the formation of voids.

In accordance with the objects of this invention a new method of metallization of an integrated circuit is achieved. This method can be used for a first metallization to contact the semiconductor substrate regions or for a subsequent metallizations for interconnection within the integrated circuit. An insulating layer is provided over the surface of a semiconductor substrate or over a metallization layer. At least one contact opening is made through the insulating layer to the semiconductor substrate or to the metallization layer. A barrier metal layer is deposited over the surface of the substrate and within the contact opening wherein most of the barrier metal is deposited on the bottom of the contact opening rather than on the sides of the opening. A metal layer is cold sputtered over the barrier metal layer, then the metal is hot sputtered over the cold-sputtered metal layer wherein the cold and hot sputtering are continuous operations to complete the metallization of the integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
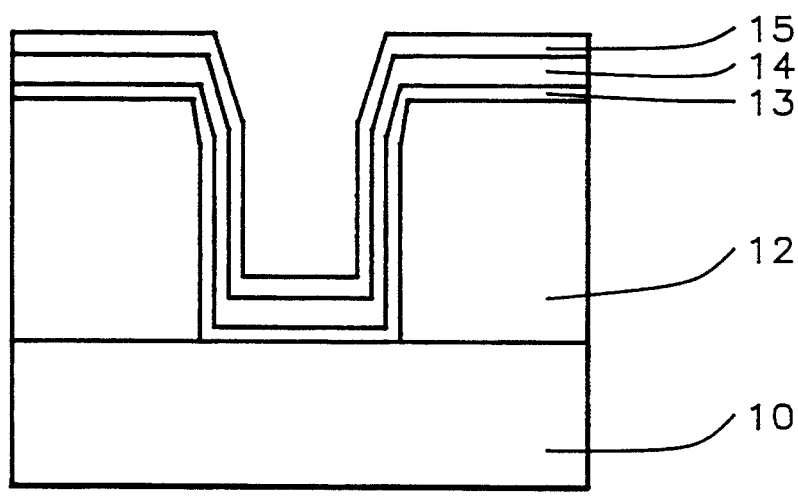
FIGS. 1 through 5 schematically illustrate in cross-sectional representation one preferred embodiment of this invention.

Referring now to FIG. 1, there is shown a portion of a partially completed integrated circuit. The semiconductor substrate 10 is preferably composed of monocrystalline silicon. An insulating layer 12, preferably composed of TEOS oxide, borophosphosilicate glass (BPSG), or the like, is deposited by low pressure chemical vapor deposition (LPCVD), atmospheric pressure chemical vapor deposition (APCVD), or plasma-enhanced chemical vapor deposition (PECVD) to a thickness of between about 4000 to 10,000 Angstroms.

A pattern of contact openings are formed through the insulating structure to the semiconductor substrate 10 wherein there may be device regions formed therein as is well understood by those skilled in the art. Conventional lithography and etching techniques are used to form this pattern of openings. For simplicity, a single opening is shown in the Figs. and device regions in the semiconductor substrate are not shown, since they do not form a part of the invention.

A barrier metal layer is sputtered over the surface of the substrate and within the contact openings. A collimator is used during this sputtering so that most of the barrier metal coats the bottom of the opening and only a thin layer is formed on the sides of the contact openings. The barrier metal layer is be made up of multilayers. The first layer 13 is composed of titanium and is between about 50 to 300 Angstroms thick. The second layer 14 is composed of either titanium nitride or titanium tungsten and is between about 300 to 2000 Angstroms thick, and preferably between 750 and 2000 Angstroms thick. This second barrier metal layer prevents junction leakage. A final layer 15 of titanium between about 300 to 800 Angstroms in thickness is deposited to complete the barrier metal layer. The top titanium layer 15 overcomes the silicon nodule formation at the interface of the titanium nitride and the aluminum layers. It may be that the silicon and titanium combine to take away the possibility of silicon nodules forming.

Figure 2:
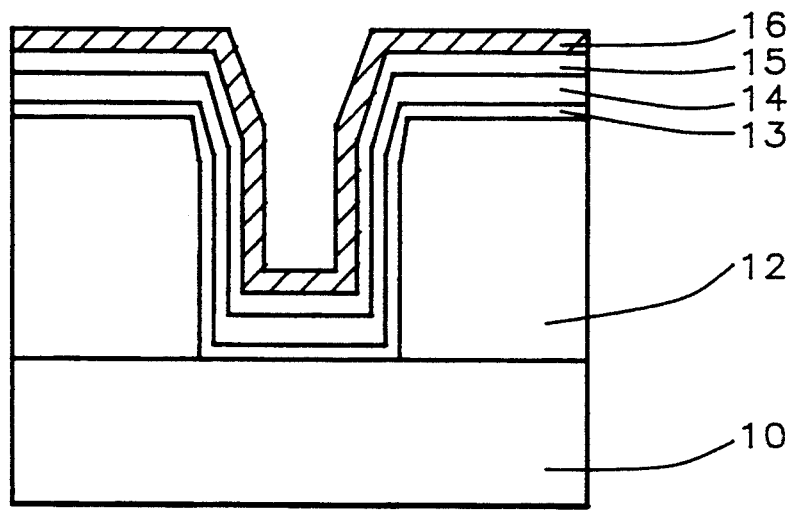

There is a cool down period, followed by the metal deposition, now to be described. Referring now to FIG. 2, a first cold sputtering 16 is performed. The preferred metal is aluminum or an aluminum alloy, such as AL 1% Si 0.5% Cu, is used. Alternative alloys are AL 0.5% Cu, AL 1% Cu, AL 1% Si, AL 2% Si, and the like. The cold deposition rate should be as high as possible at more than about 150 Angstroms/sec and preferably more than about 180 Angstroms/sec to assure deposition at a temperature of less than about 150° C. and to assure a full and continuous film in the contact openings. It is preferred to operate at less than about 25° C. If the temperature rises above about 150° C., the aluminum becomes mobile and nucleates in small areas causing the continuous film to be lost. Little or no argon gas is used during the cold sputtering deposition.

Figure 3:
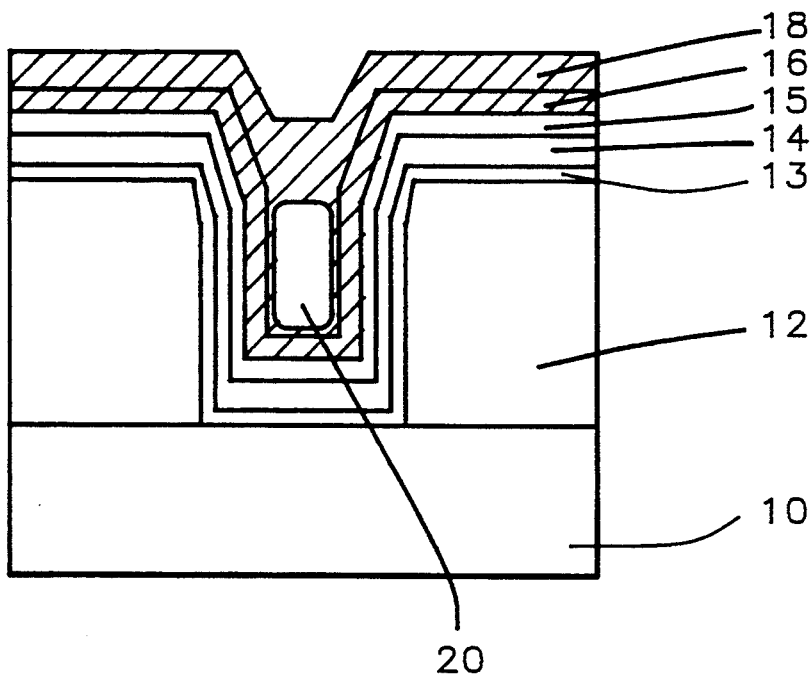

A hot deposition 18 (shown in FIG. 3) immediately follows the cold deposition. A multi-chamber sputterer, such as a Varian M2000/8 sputtering system machine made by the Varian Corporation, 3075 Hansen Way M/S K-227, Palo Alto, Calif. 94303-1025, is used so that there is no interruption to move the wafer in and out of the sputterer. Argon is used as the heating gas during the hot sputtering step in the preferred sputtering machine. The chamber is heated to between about 500° to 550° C. After cold sputtering, the wafer is moved into the already heated hot sputtering chamber and hot sputtering commences immediately. Alternatively, only one chamber could be used for both the cold and hot sputtering. The backside Argon gas could be turned off so that the wafer is cool for the cold sputtering, the backside Argon gas is turned on and the hot sputtering proceeds. The collimator is not used during the cold and hot metal sputtering steps, but only during the barrier metal formation step.

The hot deposition rate should be as low as possible, less than about 50 Angstroms/sec and preferably less than 20 Angstroms/sec. When hot sputtering begins, the void 20 is formed. This low deposition rate will cause the void 20 to be removed by surface tension.

Figure 4:
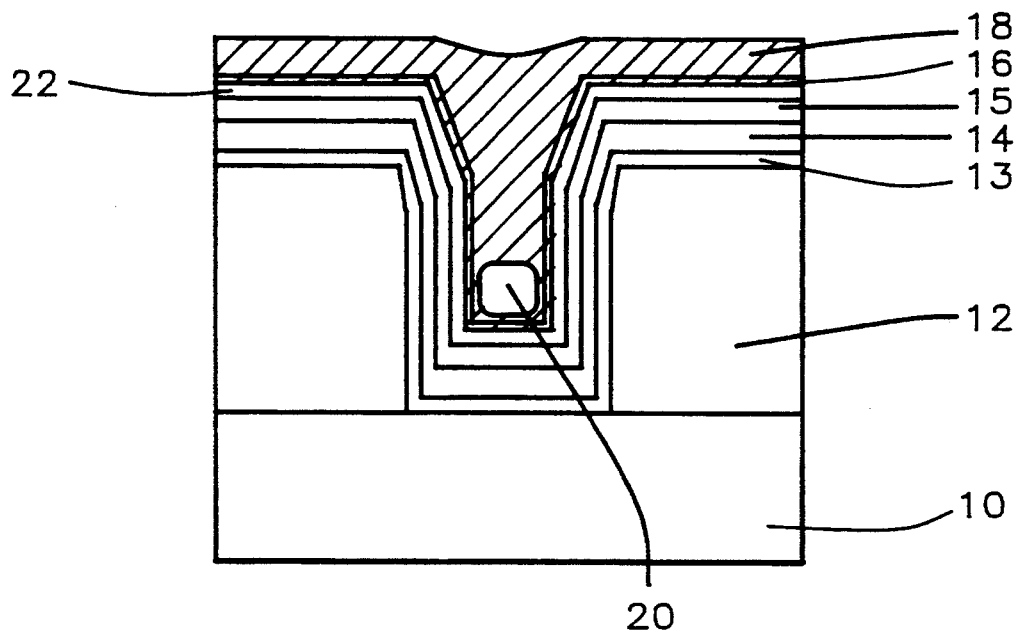
Figure 5:
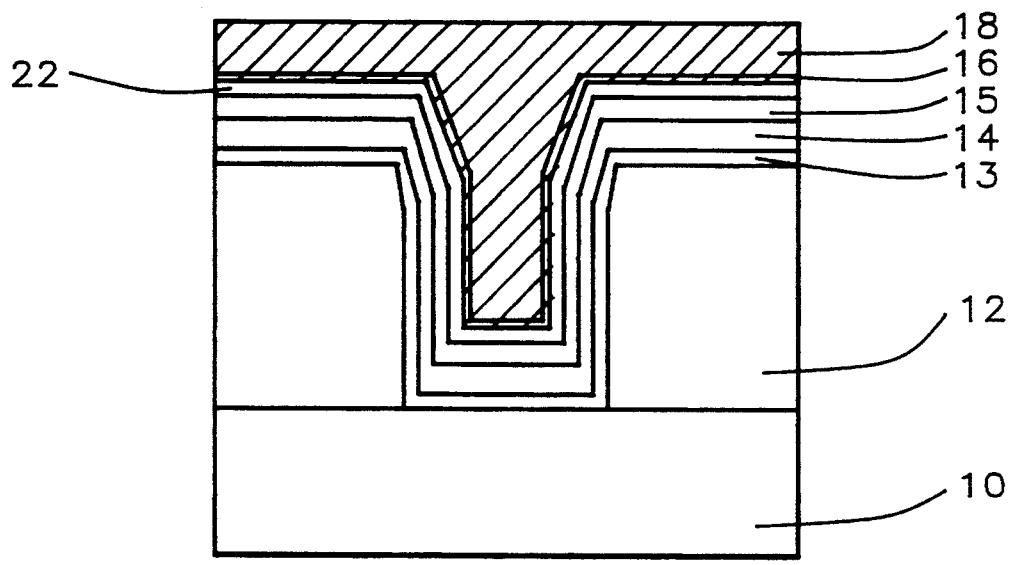

Referring now to FIG. 4, a titanium-aluminum alloy 22 is formed between the cold deposited aluminum and the titanium layer 14. A high surface energy results in a small surface area. The surface energy of the titanium-aluminum alloy 22 is higher than the surface energy of the aluminum alloy 16, 18. Therefore, the surface area of the titanium-aluminum alloy 22 becomes smaller and smaller during the process and disappears at the final step; that is, the void 20 disappears. In FIG. 4, the void 20 has been reduced in size. It is critical that the temperature must remain above about 500° C. during the hot deposition; otherwise the void will not be removed completely. Referring now to FIG. 5, the contact opening has been filled completely and the void removed. The resulting metallization has an aluminum grain size of as much as 3 to 5 micrometers which will not cause problems for the resulting device.

EXAMPLE

The following Example is given to show the important features of the invention and to aid in the understanding thereof and variations may be made by one skilled in the art without departing from the spirit and scope of the invention.

The following table indicates the range of thicknesses of the cold and hot aluminum that would be required for various feature sizes.

TABLE 1

| Feature size (in microns) | Cold AL thickness (in Angstroms) | Hot Al Thickness (in Angstroms) |
| --- | --- | --- |
| 0.8 | 2000–4000 | 2500–7000 |
| 0.6 | 2000–4000 | 2500–7000 |
| 0.5 | 2000–4000 | 2500–7000 |
| 0.3 | 1500–3000 | 2500–7000 |

The thickness is dependent upon the aspect ratio. For example, for a feature size of 0.6 microns, a shallow contact may require about 3000 Angstroms thickness of hot aluminum, while a very deep contact (e.g., 1.6 micrometers high by 0.4 micrometers wide) may require about 6000 Angstroms thickness of hot aluminum. The hot deposition process temperature is also dependent on the aspect ratio, although higher than 500° C. is preferred.

Figure 6:
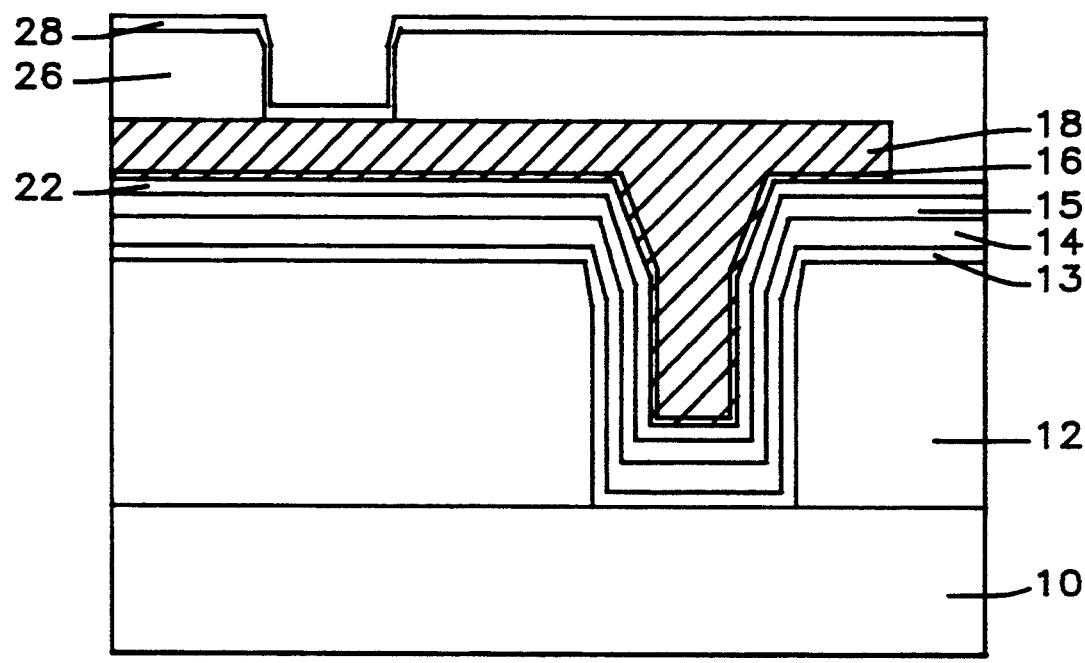
FIGS. 6 through 8 schematically illustrate in cross-sectional representation a second preferred embodiment of this invention.
Figure 7:
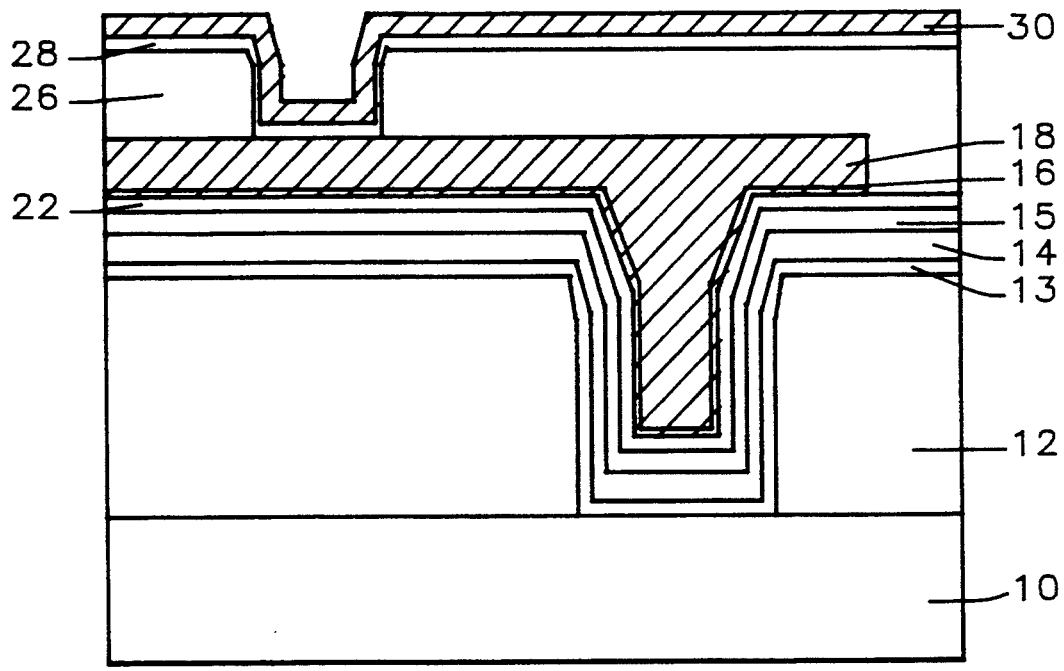
Figure 8:
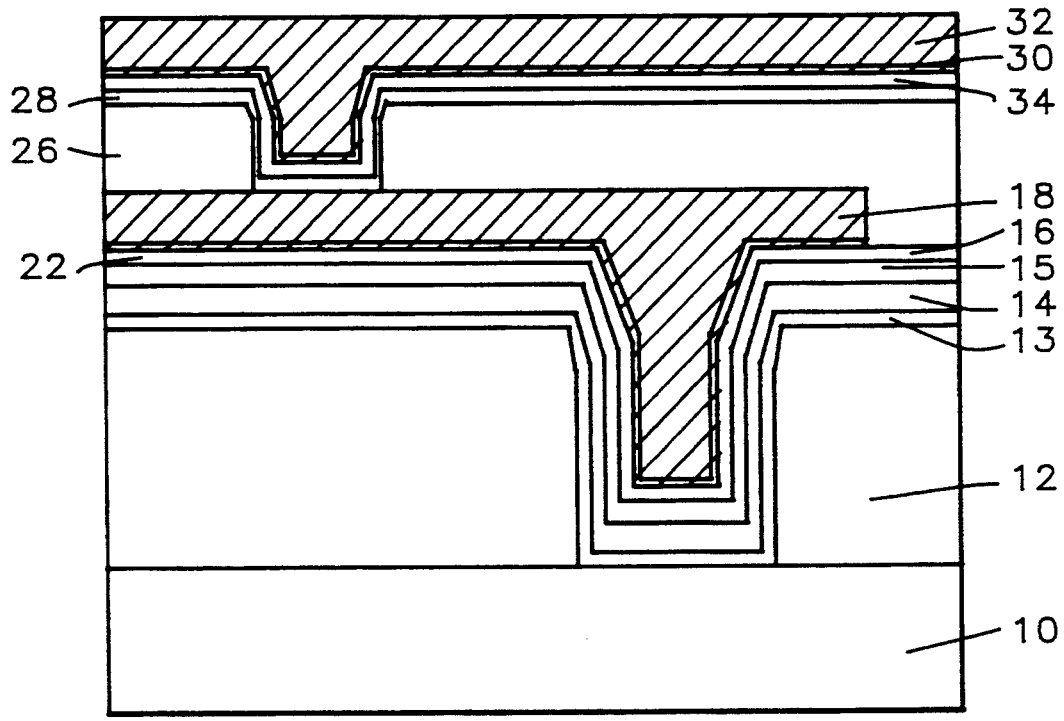

In the second preferred embodiment of the present invention shown in FIGS. 6 to 8, the metallization process can be used to make multilevel interconnections; that is, second, third, etc., levels of metal connected to one another. Referring now to FIG. 6, the first metallization has been completed as described above for the first embodiment. The first metal layer 16, 18 (cold and hot sputtered aluminum, respectively) has been patterned and a second insulating layer 26 has been deposited over the surface of the substrate. A contact or via opening has been made through the second insulating layer 26 to the first metal layer 16, 18. A barrier metal layer 28 is sputter deposited over the surface of the substrate and within the contact opening. This barrier metal layer consists only of titanium deposited to a thickness of between about 500 to 2000 Angstroms. This barrier metal layer is used for wetting; to promote adherence of the new metal layer to the metal exposed within the contact opening. A collimator may or may not be used in this embodiment. The problem of silicon nodules does not exist in this embodiment because of the titanium-aluminum alloy formation.

Referring now to FIG. 7, cold sputtered aluminum 30 is deposited at a temperature of less than about 150° C. and preferably less than about 25° C. as described above for the first embodiment. The high deposition rate is as above. The process continues as in the first embodiment with the hot sputtered aluminum 32 and the formation of the aluminum-titanium alloy 34 at the titanium/cold aluminum interface. FIG. 8 shows the completed void free structure. As is understood by those skilled in the art, the contact or via 30, 32 to electrically contact metal contact 16, 18 can be made anywhere a 16, 18 metal line is present on layer 12.

The metallization process of the present invention can be used for all levels of metallization and results in a good step coverage filling of contact openings, even those with high aspect ratios, with the absence of voids.

While the invention has been particularly shown and described with reference to the preferred embodiments thereof, it will be understood by those skilled in the art that various changes in form and details may be made without departing from the spirit and scope of the invention.

What is claimed is:

1. The method of metallization of an integrated circuit comprising:

providing an insulating layer over the surface of a semiconductor substrate;

providing at least one contact opening through said insulating layer to said semiconductor substrate;

depositing a barrier metal layer over the surface of said substrate and within said contact opening wherein most of said barrier metal is deposited on the bottom of said contact opening rather than on the sides of said opening;

cold sputtering an aluminum layer over said barrier metal layer at a temperature of less than about 150° C. and a deposition rate of more than about 180 Angstroms/sec.; and hot sputtering an aluminum layer over said cold-sputtered layer at a temperature of more than about 500° C. and at a deposition rate of less than about 50 Angstroms/sec. wherein said cold and hot sputtering are continuous operations to complete said metallization of said integrated circuit.

2. The method of claim 1 wherein said insulating layer is composed of silicon dioxide deposited to a thickness of between about 4000 to 10,000 Angstroms.

3. The method of claim 1 wherein said barrier metal layer is composed of a multilayer of titanium, titanium nitride, and titanium and wherein a collimator is used in sputtering this multilayer so that most of said multilayer is deposited on the bottom of said contact opening rather than on the sidewalls of said opening.

4. The method of claim 3 wherein the thicknesses of said multilayer are between about 50 to 300 Angstroms of titanium, 750 to 2000 Angstroms of titanium nitride, and 300 to 800 Angstroms of titanium.

5. The method of claim 1 wherein said cold sputtering of said aluminum layer is performed at a temperature of between about 20° and 150° C.

6. The method of claim 1 wherein said cold sputtering of said aluminum layer is performed at a high deposition rate of more than about 150 Angstroms/sec so as to assure a full and continuous film within said contact opening.

7. The method of claim 1 wherein said hot sputtering of said aluminum layer is performed at a temperature of between about 500° to 550° C.

8. The method of claim 1 wherein said hot sputtering of said aluminum layer is performed at a very low deposition rate of less than about 20 Angstroms/sec.

9. The method of claim 8 wherein said hot sputtering of said aluminum layer at a very low deposition rate causes no void to be formed within said contact opening.

10. The method of claim 8 wherein said hot sputtering of said aluminum layer at a very low deposition rate causes the formation of an alloy between said cold sputtered aluminum layer and said barrier metal layer wherein said alloy prevents formation of a void within said contact opening.

11. The method of metallization of an integrated circuit comprising:
providing a first insulating layer over the surface of a semiconductor substrate;
providing at least a first metallization layer over said insulating layer;
providing a second insulating layer over the surface of said first metallization layer;
providing at least one contact opening through said second insulating layer to said first metallization layer;
depositing a barrier metal layer composed of titanium over the surface of said substrate and within said contact opening wherein most of said barrier metal is deposited on the bottom of said contact opening rather than on the sides of said opening by a collimator process;
cold sputtering an aluminum layer over said barrier metal layer at a temperature of less than about 150° C. and a deposition rate of more than about 180 Angstroms/sec.; and
hot sputtering an aluminum layer over said cold-sputtered layer at a temperature of more than about 500° C. and at a deposition rate of less than about 50 Angstroms/sec. wherein said cold and hot sputtering are continuous operations to complete said metallization of said integrated circuit.

12. The method of claim 11 wherein said barrier metal layer is composed of titanium, titanium nitride and titanium.

13. The method of claim 11 wherein the thicknesses of said barrier layer is between about 500 to 2000 Angstroms.

14. The method of claim 11 wherein said cold sputtering of said aluminum layer is performed at a high deposition rate of more than about 150 Angstroms/sec so as to assure a full and continuous film within said contact opening.

15. The method of claim 11 wherein said hot sputtering of said aluminum layer is performed at a temperature of between about 500° to 550° C.

16. The method of claim 11 wherein said hot sputtering of said aluminum layer is performed at a low deposition rate of less than about 20 Angstroms/sec.

17. The method of claim 16 wherein said hot sputtering of said aluminum layer at a low deposition rate causes no void to be formed within said contact opening.

18. The method of claim 16 wherein said hot sputtering of said aluminum layer at a low deposition rate causes the formation of an alloy between said cold sputtered aluminum layer and said barrier metal layer wherein said alloy prevents formation of a void within said contact opening.

19. The method of metallization of an integrated circuit comprising:
providing an insulating layer over a conducting layer on a semiconductor substrate;
providing at least one contact opening through said insulating layer to said conducting layer;
depositing a barrier metal layer composed of titanium over the surface of said substrate and within said contact opening wherein most of said barrier metal is deposited on the bottom of said contact opening rather than on the sides of said opening by a collimator process:
cold sputtering an aluminum layer over said barrier metal layer at a temperature of less than about 150° C. and a deposition rate of more than about 180 Angstroms/sec.; and
hot sputtering an aluminum layer over said cold-sputtered layer at a temperature of more than about 500° C. and at a deposition rate of less than about 50 Angstroms/sec. wherein said cold and hot sputtering are continuous operations to complete said metallization of said integrated circuit.

20. The method of claim 19 wherein said conducting layer is said semiconductor substrate.

21. The method of claim 20 wherein said barrier metal layer is composed of a multilayer of titanium, titanium nitride, and titanium.

22. The method of claim 21 wherein the thicknesses of said multilayer are between about 50 to 300 Angstroms of titanium, 750 to 2000 Angstroms of titanium nitride, and 300 to 800 Angstroms of titanium.

23. The method of claim 19 wherein said conducting layer is at least a first metallization layer over a first insulating layer over said semiconductor substrate.

24. The method of claim 23 wherein the thicknesses of said barrier layer is between about 500 to 2000 Angstroms.

25. The method of claim 19 wherein said cold sputtering of said aluminum layer is performed at a temperature of between about 20° to 150° C.

26. The method of claim 19 wherein said hot sputtering of said aluminum layer is performed at a temperature of between about 500° to 550° C.

27. The method of claim 19 wherein said hot sputtering of said aluminum layer is performed at a low deposition rate of less than about 20 Angstroms/sec.

28. The method of claim 27 wherein said hot sputtering of said aluminum layer at a low deposition rate causes no void to be formed within said contact opening.

29. The method of claim 27 wherein said hot sputtering of said aluminum layer at a very low deposition rate causes the formation of an alloy between said cold sputtered aluminum layer and said barrier metal layer wherein said alloy prevents formation of a void within said contact opening.

* * * * *